United States Patent
Wang et al.

(10) Patent No.: US 9,184,730 B2
(45) Date of Patent: Nov. 10, 2015

(54) DYNAMIC FEED-FORWARD OPAMP-BASED CIRCUIT

(71) Applicant: MediaTek Inc., Hsin-Chu (TW)

(72) Inventors: Chi Yun Wang, Tainan (TW); Chih-Hong Lou, Jiaosi Township, Yilan County (TW)

(73) Assignee: MEDIATEK INC., Hsin-Chu (TW)

( * ) Notice: Subject to any disclaimer, the term of this patent is extended or adjusted under 35 U.S.C. 154(b) by 29 days.

(21) Appl. No.: 14/138,557

(22) Filed: Dec. 23, 2013

(65) Prior Publication Data

US 2014/0218113 A1    Aug. 7, 2014

Related U.S. Application Data

(60) Provisional application No. 61/761,919, filed on Feb. 7, 2013.

(51) Int. Cl.
  *H03F 3/52* (2006.01)
  *H03H 11/12* (2006.01)
  *H05B 33/08* (2006.01)
  *H05B 37/02* (2006.01)

(52) U.S. Cl.
  CPC ....... *H03H 11/1217* (2013.01); *H05B 33/0845* (2013.01); *H05B 33/0854* (2013.01); *H05B 37/0218* (2013.01); *Y02B 20/46* (2013.01)

(58) Field of Classification Search
  CPC ............... H03F 1/42; H03F 1/36; H03F 1/34; H03F 1/08; H03F 1/083; H05B 33/0854; H05B 37/0218; Y02B 20/46; H03H 11/1217
  USPC .................................... 330/69, 107, 109, 254
  See application file for complete search history.

(56) References Cited

U.S. PATENT DOCUMENTS

| | | | | |
|---|---|---|---|---|
| 5,880,634 | A * | 3/1999 | Babanezhad | 330/126 |
| 6,573,790 | B2 * | 6/2003 | Steensgaard-Madsen | 330/107 |
| 7,948,309 | B2 * | 5/2011 | Mak et al. | 330/98 |
| 7,999,612 | B2 * | 8/2011 | Hsieh | 330/69 |
| 8,791,755 | B2 * | 7/2014 | Giotta et al. | 330/10 |
| 2005/0088228 | A1 * | 4/2005 | Tai | 330/69 |

OTHER PUBLICATIONS

Shettigar, P., et al.; "A 15mW 3.6GS/s CT-DS ADC with 36MHz Bandwidth and 83dB DR in 90nm COMS;" IEEE International Solid-State Circuits Conference; Session 8; Delta-Sigma Converters; 2012; pp. 156-158.

* cited by examiner

*Primary Examiner* — Steven J Mottola
*Assistant Examiner* — Hafizur Rahman
(74) *Attorney, Agent, or Firm* — McClure, Qualey & Rodack, LLP

(57) ABSTRACT

A dynamic feed-forward OPAMP-based circuit is provided. A first amplifying stage amplifies a pair of input differential signals to provide a pair of intermediate differential signals. A second amplifying stage amplifies the pair of intermediate differential signals to provide a pair of output differential signals. A first capacitor is coupled to a non-inverting input terminal of the first amplifying stage. A second capacitor is coupled to an inverting input terminal of the first amplifying stage. A feed-forward transconductance stage is coupled between the first and second capacitors and the second amplifying stage. The first and second capacitors and the feed-forward stage form a high-frequency path with a first gain curve, and the first amplifying stage and the second amplifying stage form a high-gain path with a second gain curve. The operational amplifier provides an open-loop gain according to the first and second gain curves.

18 Claims, 9 Drawing Sheets

US 9,184,730 B2

DYNAMIC FEED-FORWARD OPAMP-BASED CIRCUIT

CROSS REFERENCE TO RELATED APPLICATIONS

This Application claims priority of U.S. Provisional Application No. 61/761,919, filed on Feb. 7, 2013, the entirety of which is incorporated by reference herein.

BACKGROUND OF THE INVENTION

1. Field of the Invention

The invention relates to an operational amplifier (OPAMP), and more particularly, to an operational amplifier of a dynamic feed-forward OPAMP-based circuit.

2. Description of the Related Art

Operational amplifiers (OPAMPs) have been applied extensively in the field of electrical devices and electronics, such as inverting amplifiers, integrators, and filter circuits, to name just a few instances. With the rapid scaling in CMOS processes, supply voltages in VLSL have been dramatically reduced in recent years. Acting as a fundamental block in most analog systems, operational amplifiers are required to achieve high gain and large bandwidth simultaneously in low-voltage applications. Since conventional cascode amplifiers, which increase the gain by stacking up transistors, are not suitable in low-voltage designs due to small voltage swings, more circuit designers are aware of the importance of multi-stage amplifiers, which boost the gain by increasing the number of gain stages horizontally. However, all multi-stage amplifiers suffer close-loop stability problems due to their multiple-pole nature in the small-signal transfer functions. Therefore, many frequency compensation topologies have been proposed to ensure the stability of the multi-stage amplifiers. Generally, the operational amplifier applied in the conventional driver chip is normally a two-stage amplifier having a first-stage amplifying circuit for gain enhancement and a second-stage output circuit for driving the capacitive or resistive load. However, multi-stage operational amplifiers are also gaining in popularity.

The most relevant characteristics of an amplifier circuit are usually gain and bandwidth. There is an inverse relationship between the gain and the bandwidth of amplifiers. In general, higher gain values are associated with lower bandwidths, and lower gain values are associated with higher bandwidths. Various compensation techniques, such as Miller compensation or Ahuja compensation, are known for adjusting the frequency of the poles of the amplifier. Miller compensation employs a feedback capacitor connected across an input and output of the second amplifier stage. In Ahuja compensation, a current gain device is added in a feedback loop of the second amplifier stage.

BRIEF SUMMARY OF THE INVENTION

Dynamic feed-forward OPAMP-based circuits are provided. An embodiment of a dynamic feed-forward OPAMP-based circuit is provided. The dynamic feed-forward OPAMP-based circuit comprises an operational amplifier. The operational amplifier comprises: a first amplifying stage, amplifying a pair of input differential signals to provide a pair of intermediate differential signals; a second amplifying stage, amplifying the pair of intermediate differential signals to provide a pair of output differential signals; a first capacitor coupled to a non-inverting input terminal of the first amplifying stage; a second capacitor coupled to an inverting input terminal of the first amplifying stage; and a feed-forward transconductance stage coupled between the first and second capacitors and the second amplifying stage. The first and second capacitors and the feed-forward stage form a high-frequency path with a first gain curve for the pair of input differential signals, and the first amplifying stage and the second amplifying stage form a high-gain path with a second gain curve for the pair of input differential signals. The operational amplifier provides an open-loop gain according to the first and second gain curves.

Furthermore, another embodiment of a dynamic feed-forward OPAMP-based circuit is provided. The dynamic feed-forward OPAMP-based circuit comprises an operational amplifier. The operational amplifier comprises: a first amplifying stage, amplifying a pair of input differential signals to provide a pair of intermediate differential signals; a second amplifying stage, amplifying the pair of intermediate differential signals to provide a pair of output differential signals; a first capacitor coupled to a non-inverting input terminal of the first amplifying stage; a second capacitor coupled to an inverting input terminal of the first amplifying stage; a feed-forward transconductance stage coupled between the first and second capacitors and the second amplifying stage; and a compensation unit coupled to the second amplifying stage, providing an effective common-mode capacitance and an effective differential-mode capacitance for the operational amplifier, wherein the effective differential-mode capacitance is smaller than the effective common-mode capacitance.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
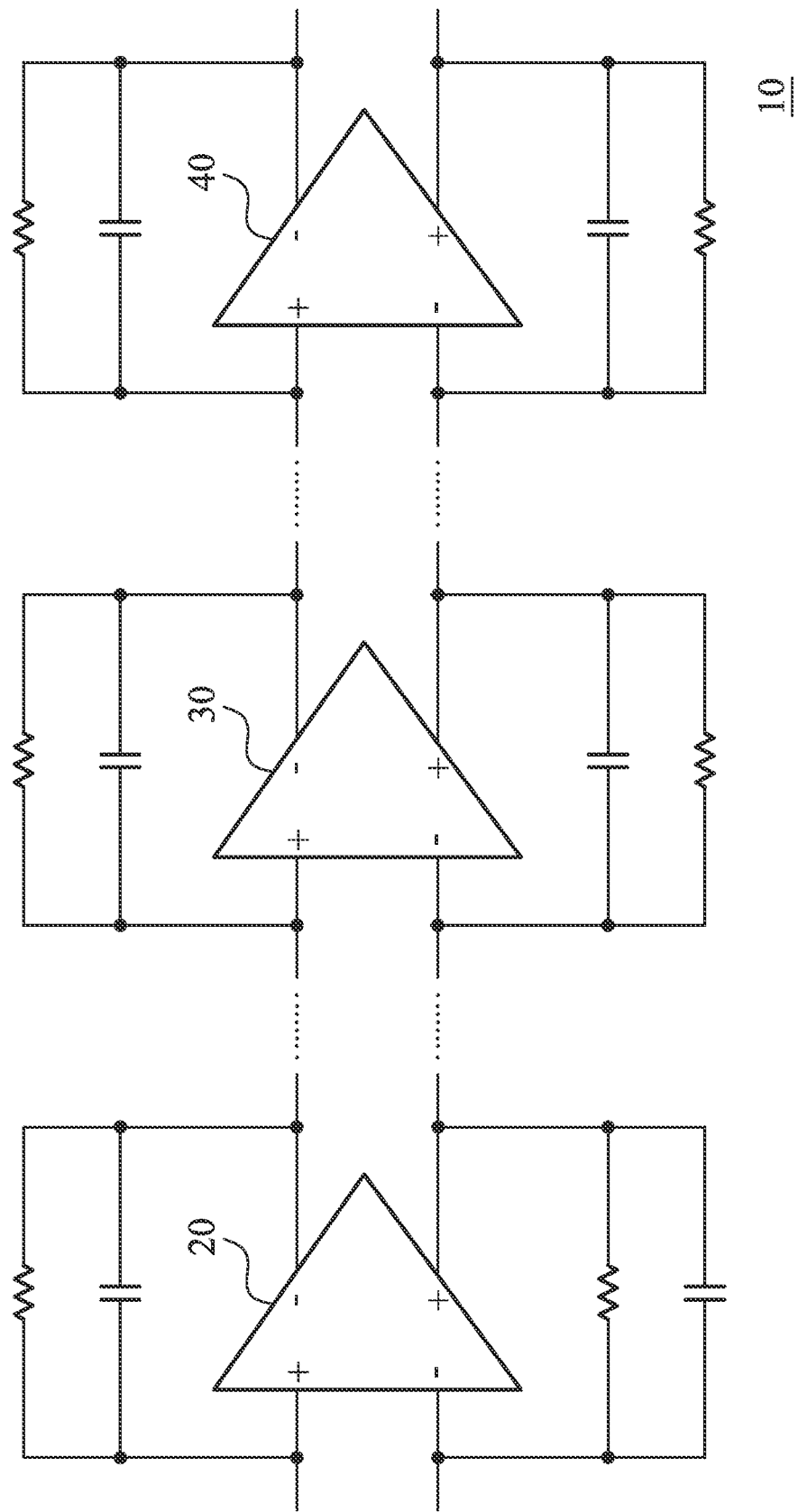
FIG. 1 shows a dynamic feed-forward OPAMP-based circuit according to an embodiment of the invention.

FIG. 1 shows a dynamic feed-forward OPAMP-based circuit 10 according to an embodiment of the invention. The dynamic feed-forward OPAMP-based circuit 10 comprises a plurality of operational amplifiers (OPAMPs) 20, 30 and 40 and other related devices (e.g. capacitors, resistors and so on). In the embodiment, the operational amplifiers 20, 30 and 40 are dynamic feed-forward class-AB amplifiers. Furthermore, the dynamic feed-forward OPAMP-based circuit 10 is applied in a transimpedance amplifier (TIA), a programmable-gain amplifier (PGA), a filter, an analog-to-digital converter (ADC) buffer or a delta-sigma analog-to-digital converter ($\Delta\Sigma$ ADC) for high-speed and wideband applications. In one embodiment, the dynamic feed-forward OPAMP-based circuit 10 comprises only one operational amplifier (e.g. 20, 30 or 40).

Figure 2:
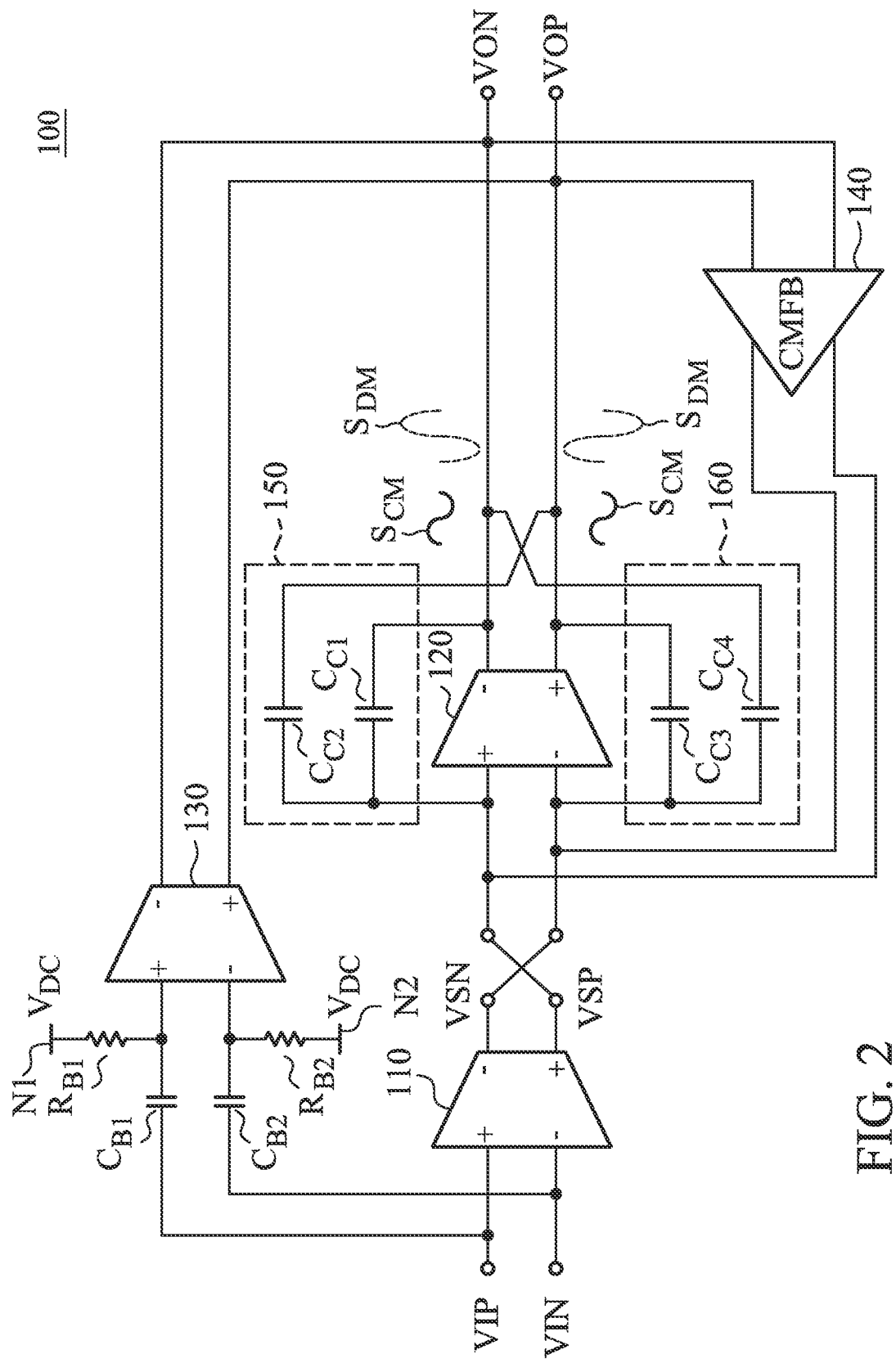
FIG. 2 shows an operational amplifier of a dynamic feed-forward OPAMP-based circuit according to an embodiment of the invention.

FIG. 2 shows an operational amplifier 100 of a dynamic feed-forward OPAMP-based circuit according to an embodiment of the invention. The operational amplifier 100 comprises two amplifying stages 110 and 120, a feed-forward transconductance stage 130 and a common-mode feedback stage (CMFB) 140. In one embodiment, the amplifying stages 110 and 120 are transconductance stages. The amplifying stage 110 has a non-inverting input terminal for receiving an input signal VIP and an inverting input terminal for receiving an input signal VIN, wherein the input signals VIP and VIN are a pair of differential signals. The amplifying stage 110 amplifies the pair of differential signals VIP and VIN, to provide a pair of differential signals VSP and VSN to the amplifying stage 120. As shown in FIG. 2, an inverting output terminal and a non-inverting output terminal of the amplifying stage 110 are coupled to an inverting input terminal and a non-inverting input terminal of the amplifying stage 120, respectively. The amplifying stage 120 amplifies the pair of differential signals VSP and VSN to output a pair of differential signals VOP and VON. The common-mode feedback stage 140 is coupled to the amplifying stage 120 in parallel, wherein the inverting output terminal and the non-inverting output terminal of the amplifying stage 120 are respectively coupled to a first input terminal and a second input terminal of the common-mode feedback stage 140, and a first output terminal and a second output terminal of the common-mode feedback stage 140 are respectively coupled to the inverting input terminal and the non-inverting input terminal of the amplifying stage 120. Furthermore, the operational amplifier 100 further comprises the capacitors $C_{B1}$ and $C_{B2}$, the resistors $R_{B1}$ and $R_{B2}$, and the compensation units 150 and 160. The capacitor $C_{B1}$ is coupled between the non-inverting input terminals of the amplifying stage 110 and the feed-forward transconductance stage 130, and the capacitor $C_{B2}$ is coupled between the inverting input terminals of the amplifying stage 110 and the feed-forward transconductance stage 130. Furthermore, the resistor $R_{B1}$ is coupled between the non-inverting input terminal of the feed-forward transconductance stage 130 and a reference node N1, and the resistor $R_{B2}$ is coupled between the inverting input terminal of the feed-forward transconductance stage 130 and a reference node N2, wherein the reference nodes N1 and N2 are used to receive a fixed reference voltage $V_{DC}$. Furthermore, an inverting output terminal and a non-inverting output terminal of the feed-forward transconductance stage 130 are coupled to the inverting output terminal and the non-inverting output terminal of the amplifying stage 120. The compensation unit 150 comprises the capacitors $C_{C1}$ and $C_{C2}$ respectively disposed in a negative feedback loop and a positive feedback loop for the non-inverting input terminal of the amplifying stage 120. For example, the capacitor $C_{C1}$ is coupled between the non-inverting input terminal and the inverting output terminal of the amplifying stage 120, and the capacitor $C_{C2}$ is coupled between the non-inverting input terminal and the non-inverting output terminal of the amplifying stage 120. Therefore, for the pair of differential signals VSP and VSN, the common-mode signals $S_{CM}$ have the same phases in the positive feedback loop and the negative feedback loop for the non-inverting input terminal of the amplifying stage 120, and the differential-mode signals $S_{DM}$ have the opposite phases in the positive feedback loop and the negative feedback loop for the non-inverting input terminal of the amplifying stage 120. Similarly, the compensation unit 160 comprises the capacitors $C_{C3}$ and $C_{C4}$ respectively disposed in a negative feedback loop and a positive feedback loop for the inverting input terminal of the amplifying stage 120, wherein the capacitor $C_{C1}$ and $C_{C3}$ have the same capacitances, and the capacitor $C_{C2}$ and $C_{C4}$ have the same capacitances.

Figure 3A:
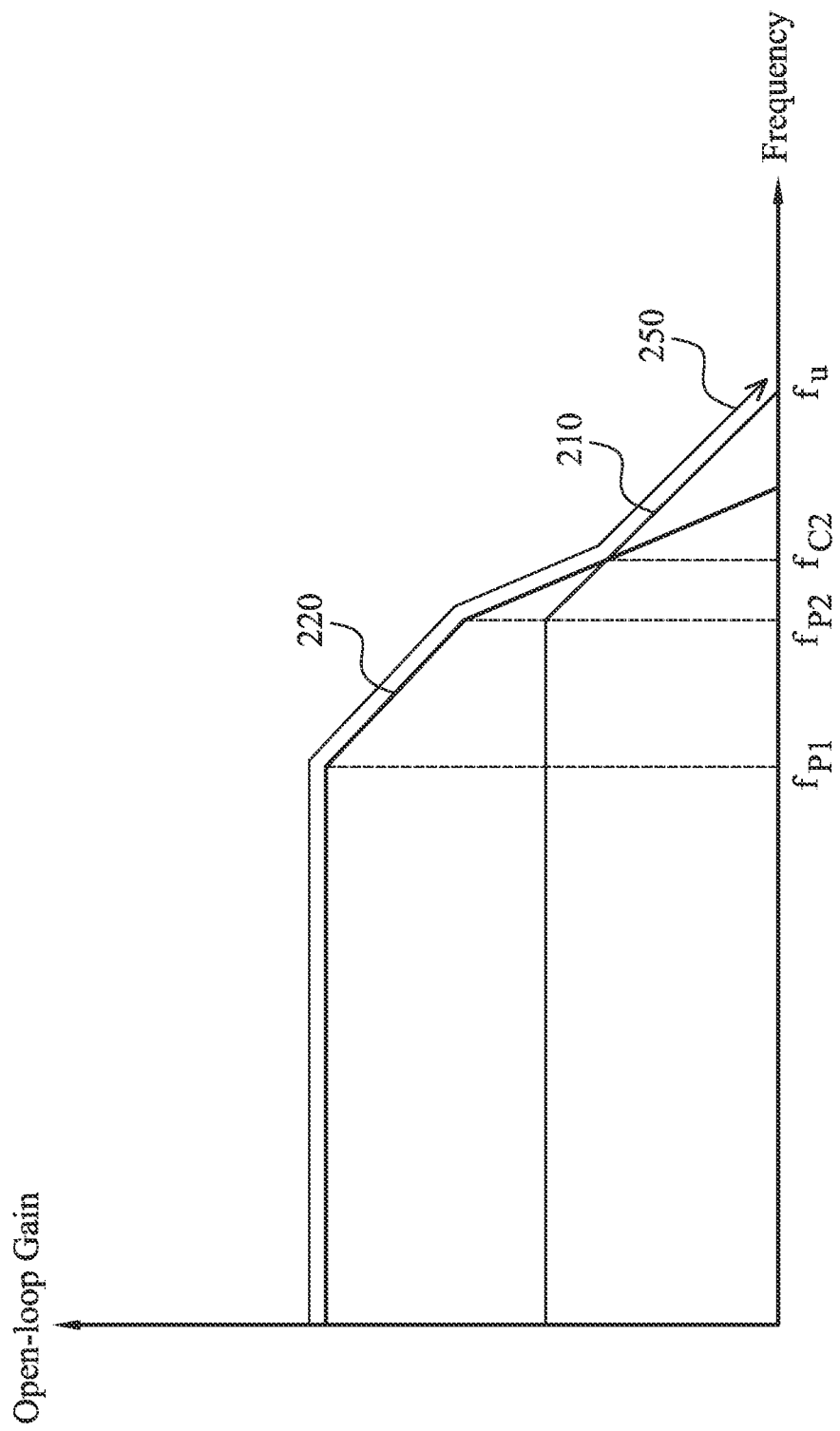
FIG. 3A shows a frequency response diagram illustrating the relationship between an open-loop gain and the frequency of the pair of input differential signals of the operational amplifier of FIG. 2.
Figure 3B:
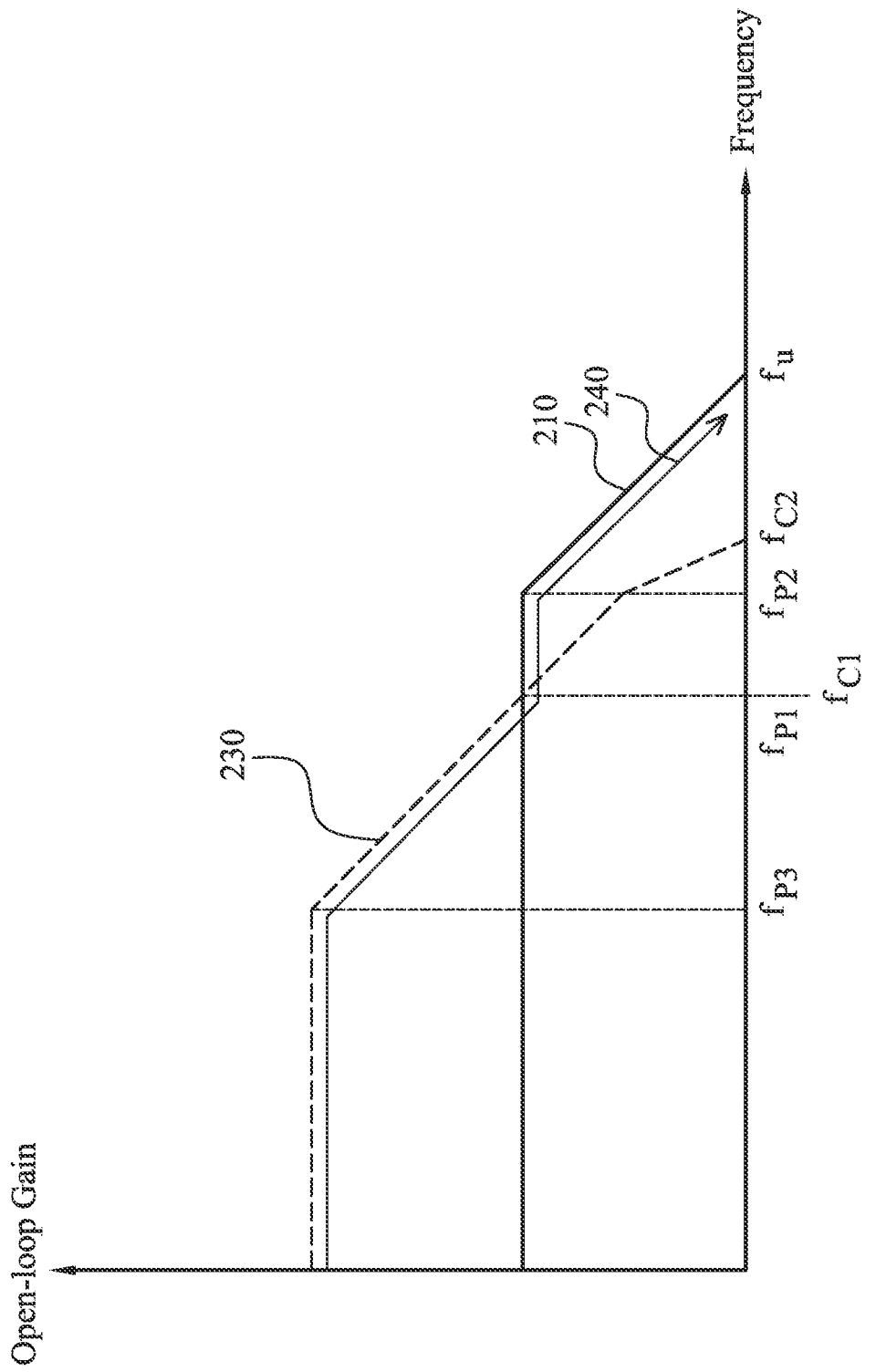
FIG. 3B shows a frequency response diagram illustrating a relationship between an open-loop gain and a frequency of a conventional operational amplifier.

FIG. 3A shows a frequency response diagram illustrating a relationship between an open-loop gain and a frequency of the operational amplifier 100 of FIG. 2. Referring to FIG. 2A and FIG. 3 together, the capacitors $C_{B1}$ and $C_{B2}$ and the feed-forward transconductance stage 130 form a high-frequency path with a gain curve 210 for the pair of input differential signals VIP and VIN, wherein the gain curve 210 comprises a dominant pole $f_{P2}$. The amplifying stage 110 and the amplifying stage 120 form a high-gain path with a gain curve 220 for the pair of input differential signals VIP and VIN, wherein the gain curve 220 comprises two dominant poles $f_{P1}$ and $f_{P2}$ ($f_{P1}<f_{P2}$). In the operational amplifier 100, the overall stability is determined by the high-frequency path, wherein the capacitors $C_{B1}$ and $C_{B2}$ are used to provide AC-coupling for the high-frequency path. According to the compensation units 150 and 160, the operational amplifier 100 provides the open-loop gain according to the gain curve 220 when the frequency of the pair of input differential signals VIP and VIN is smaller than a frequency $f_{C2}$, and the operational amplifier provides the open-loop gain according to the gain curve 210 when the frequency of the pair of input differential signals VIP and VIN is larger than the frequency $f_{C2}$, wherein the frequency $f_{C2}$ is determined according to an intersection of the gain curves 220 and 210 and $f_{P1}<f_{P2}<f_{C2}$, as shown in label 250. FIG. 3B shows a frequency response diagram illustrating a relationship between an open-loop gain and a frequency of a conventional operational amplifier. In the conventional operational amplifier, a compensation capacitor $C_C$ disposed in each negative feedback loop of an output amplifying stage will affect the open-loop gain for the high-gain path, as shown in a gain curve 230. The gain curve 230 comprises two dominant poles $f_{P3}$ and $f_{P2}$ ($f_{P3}<f_{P1}<f_{P2}$). Thus, the conventional operational amplifier provides the open-loop gain according to the gain curve 230 when the frequency of the pair of input differential signals VIP and VIN is smaller than a frequency $f_{C1}$, and the conventional operational amplifier provides the open-loop gain according to the gain curve 210 when the frequency of the pair of input differential signals VIP and VIN is larger than the frequency $f_{C1}$, wherein the frequency $f_{C1}$ is determined according to an intersection of the gain curves 230 and 210 and $f_{P1}<f_{C1}<f_{P2}$, as shown in label 240. Referring to FIG. 3A and FIG. 3B together, compared with the open-loop gain 240 of the conventional operational amplifier, the open-loop gain 250 is not degraded for the operational amplifier 100.

Figure 4B:
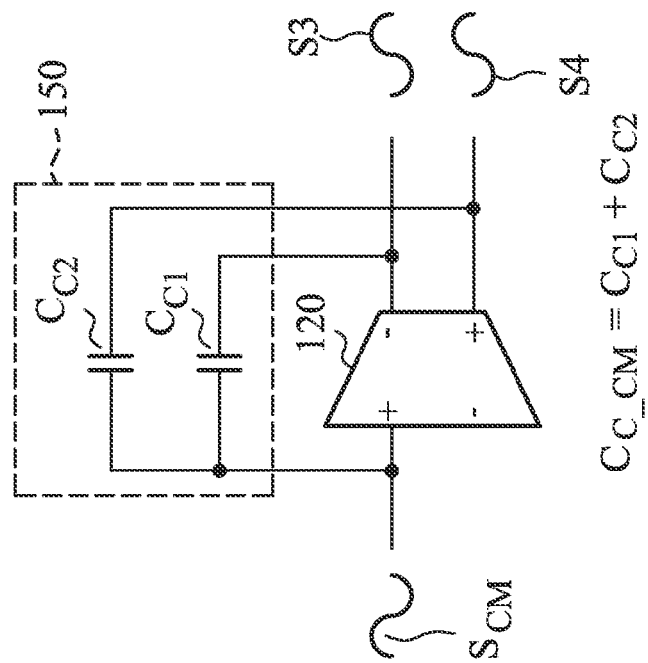
FIG. 4B shows an analysis schematic illustrating a common mode (CM) for the amplifying stage of FIG. 2.
Figure 4A:
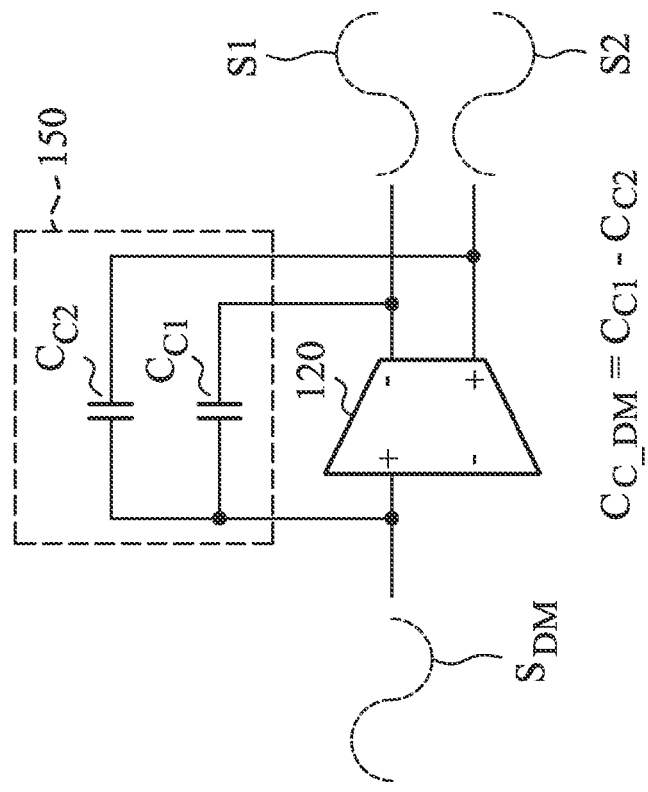
FIG. 4A shows an analysis schematic illustrating a differential mode (DM) for the amplifying stage of FIG. 2.

FIG. 4A shows an analysis schematic illustrating a differential mode (DM) for the amplifying stage 120 of FIG. 2. In order to simplify the description, only the compensation unit 150 is described. In response to a differential-mode signal $S_{DM}$ at the non-inverting input terminal of the amplifying stage 120, the amplifying stage 120 provides a signal S2 at the non-inverting output terminal thereof and a signal S1 at the inverting output terminal thereof, wherein the signal S2 and the differential-mode signal $S_{DM}$ have the same phases, and the signal S1 and the differential-mode signal $S_{DM}$ have the opposite phases. Thus, an effective differential-mode capacitance $C_{C\_DM}$ of the compensation unit 150 is equal to the difference between the capacitors $C_{C1}$ and $C_{C2}$, i.e. $C_{C\_DM}=C_{C1}-C_{C2}$. In one embodiment, the capacitors $C_{C1}$ and $C_{C2}$ are substantially identical in their capacitances (e.g. half of the compensation capacitor $C_C$, $C_{C1}=C_{C2}=\frac{1}{2} \times C_C$), thereby the effective differential-mode capacitance $C_{C\_DM}$ is close to zero. Thus, a differential-mode high-frequency open-loop gain is optimized FIG. 4B shows an analysis schematic illustrating a common mode (CM) for the amplifying stage 120 of FIG. 2. In order to simplify the description, only the compensation unit 150 is described. In response to a common-mode signal SCM at the non-inverting input terminal of the amplifying stage 120, the amplifying stage 120 provides a signal S3 at the non-inverting output terminal thereof and a signal S4 at the inverting output terminal thereof, wherein the signals S3 and S4 have the same phases and the signal S3 and the common-mode signal SCM have the opposite phases. Thus, an effective common-mode capacitance CC_CM of the compensation unit 150 is equal to a sum of the capacitors CC1 and CC2, i.e. CC_CM=CC1+CC2. In one embodiment, the capacitors CC1 and CC2 are substantially identical in their capacitances (e.g. half of the compensation capacitor CC, CC1=CC2=½ CC), thereby the effective common-mode capacitance CC_CM is close to the compensation capacitor CC.

Figure 5:
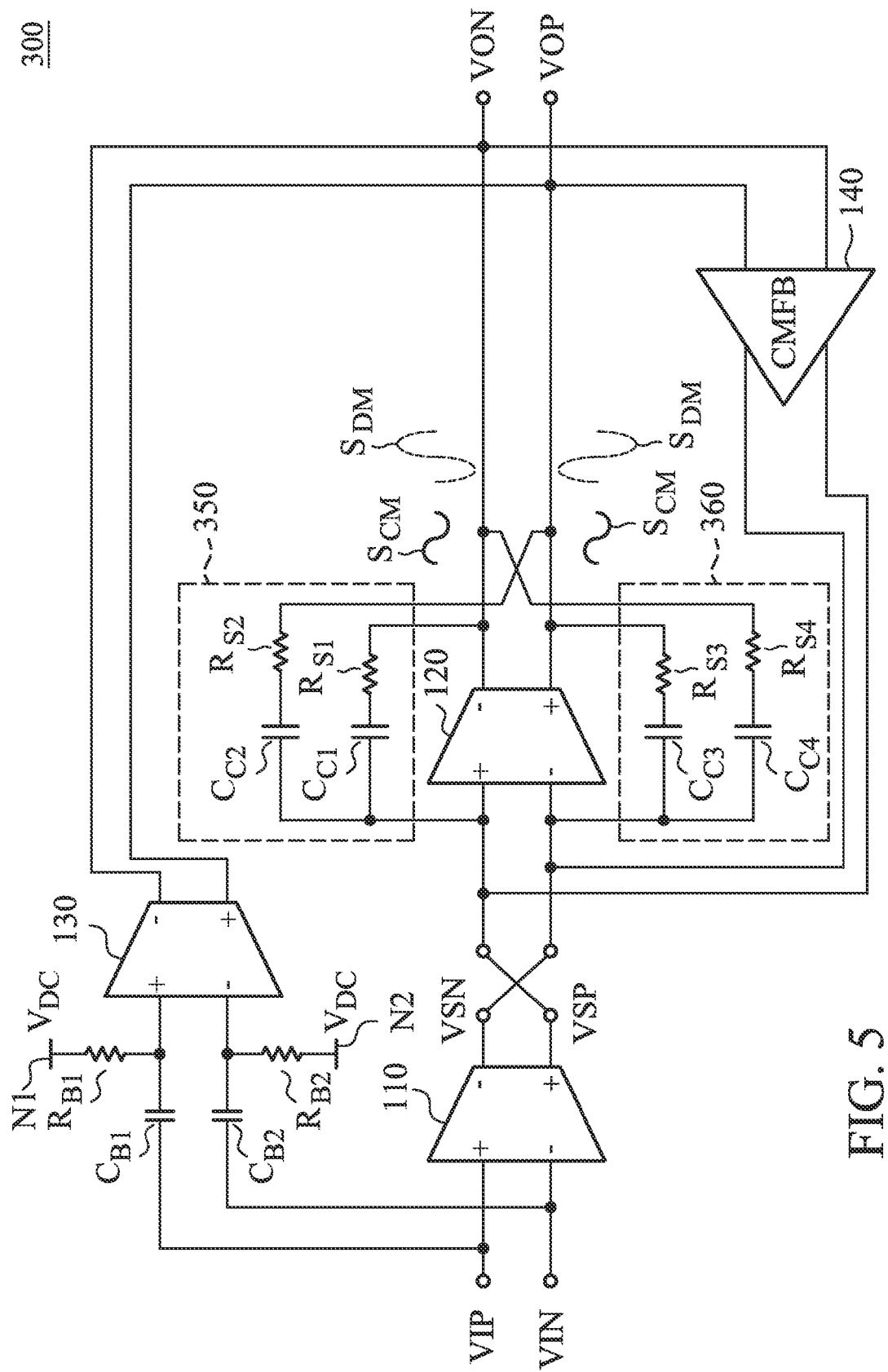
FIG. 5 shows an operational amplifier of a dynamic feed-forward OPAMP-based circuit according to another embodiment of the invention.

FIG. 5 shows an operational amplifier 300 of a dynamic feed-forward OPAMP-based circuit according to another embodiment of the invention. Compared with the operational amplifier 100 of FIG. 2, a compensation unit 350 further comprises the resistors $R_{S1}$ and $R_{S2}$ respectively coupled to the capacitors $C_{C1}$ and $C_{C2}$ in series, and a compensation unit 360 further comprises the resistors $R_{S3}$ and $R_{S4}$ respectively coupled to the capacitors $C_{C3}$ and $C_{C4}$ in series. In the embodiment, the resistor $R_{S1}$ is coupled between the capacitor $C_{C1}$ and the inverting output terminal of the amplifying stage 120, the resistor $R_{S2}$ is coupled between the capacitor $C_{C2}$ and the non-inverting output terminal of the amplifying stage 120, the resistor $R_{S3}$ is coupled between the capacitor $C_{C3}$ and the non-inverting output terminal of the amplifying stage 120, and the resistor $R_{S4}$ is coupled between the capacitor $C_{C4}$ and the inverting output terminal of the amplifying stage 120. In another embodiment, the resistor $R_{S1}$ is coupled between the capacitor $C_{C1}$ and the non-inverting input terminal of the amplifying stage 120, the resistor $R_{S2}$ is coupled between the capacitor $C_{C2}$ and the non-inverting input terminal of the amplifying stage 120, the resistor $R_{S3}$ is coupled between the capacitor $C_{C3}$ and the inverting input terminal of the amplifying stage 120, and the resistor $R_{S4}$ is coupled between the capacitor $C_{C4}$ and the inverting input terminal of the amplifying stage 120. Specifically, the series order of the resistors and capacitors can be swapped for the compensation units 350 and 360.

Figure 6:
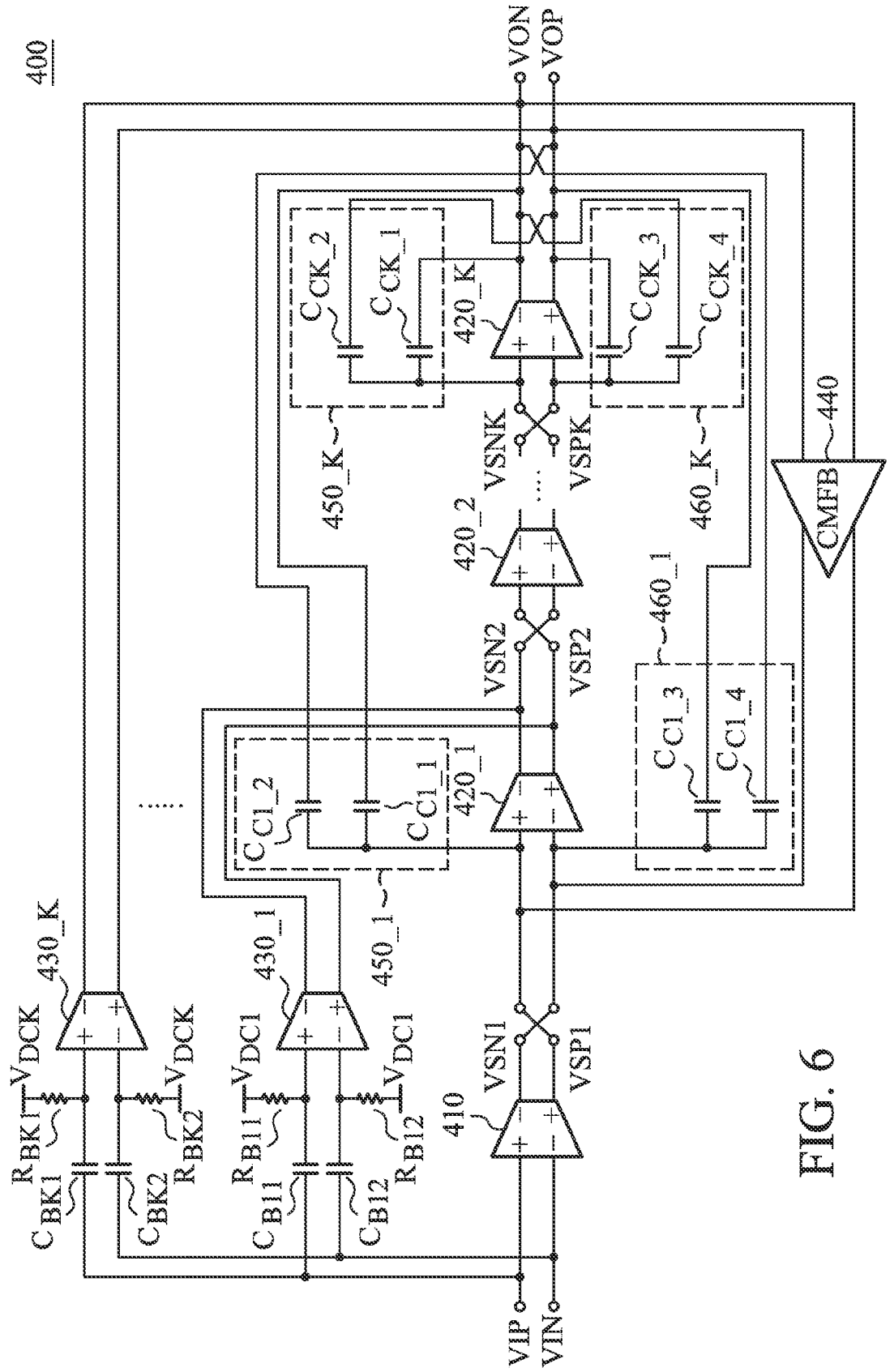
FIG. 6 shows an operational amplifier of a dynamic feed-forward OPAMP-based circuit according to another embodiment of the invention.

FIG. 6 shows an operational amplifier 400 of a dynamic feed-forward OPAMP-based circuit according to another embodiment of the invention. The operational amplifier 400 comprises an amplifying stage 410, a plurality of amplifying stages 420_1-420_K, a plurality of feed-forward transconductance stages 430_1-430_K and a common-mode feedback stage 440. The amplifying stage 410 receives and amplifies the pair of differential signals VIP and VIN, to provide a pair of differential signals VSP1 and VSN1 to the amplifying stage 420_1. The amplifying stage 420_1 amplifies the pair of differential signals VSP1 and VSN1 to output a pair of differential signals VSP2 and VSN2, and so on. Finally, the amplifying stage 420_K amplifies the pair of differential signals VSPK and VSNK to output the pair of output differential signals VOP and VON. The common-mode feedback stage 440 is coupled to the serial of amplifying stages 420_1-420_K in parallel, wherein the inverting output terminal and the non-inverting output terminal of the amplifying stage 420_K are respectively coupled to a first input terminal and a second input terminal of the common-mode feedback stage 440, and a first output terminal and a second output terminal of the common-mode feedback stage 440 are respectively coupled to the inverting input terminal and the non-inverting input terminal of the amplifying stage 420_1. Furthermore, the operational amplifier 400 further comprises a plurality of capacitors $C_{B11}$-$C_{BK1}$ and $C_{B12}$-$C_{BK2}$, a plurality of resistors $R_{B11}$-$R_{BK1}$ and $R_{B12}$-$R_{BK2}$ corresponding to the feed-forward transconductance stage 430_1-430_K. Each of the feed-forward transconductance stage 430_1-430_K is coupled to the amplifying stage 410 via the AC-coupling capacitors thereof, and the input terminals of each of the feed-forward transconductance stage 430_1-430_K is pulled to a fixed reference voltage via the corresponding resistors. Furthermore, the output terminals of each of the feed-forward transconductance stage 430_1-430_K are coupled to the output terminals of the corresponding amplifying stage. For example, the inverting output terminal and the non-inverting output terminal of the feed-forward transconductance stage 430_K are coupled to the inverting output terminal and the non-inverting output terminal of the amplifying stage 420_K. The capacitor $C_{BK1}$ is coupled between the non-inverting input terminal of the amplifying stage 410 and the non-inverting input terminal of the feed-forward transconductance stage 430_K, and the capacitor $C_{BK2}$ is coupled between the inverting input terminal of the amplifying stage 410 and the inverting input terminal of the feed-forward transconductance stage 430_K. Furthermore, the non-inverting input terminal of the feed-forward transconductance stage 430_K is pulled to a fixed reference voltage $V_{DCK}$ via the resistor $R_{BK1}$, and the inverting input terminal of the feed-forward transconductance stage 430_K is pulled to the fixed reference voltage $V_{DcK}$ via the resistor $R_{BK2}$. Furthermore, each of the amplifying stages 420_1-420_K has the corresponding compensation units. For example, a compensation unit 450_1 is coupled to the non-inverting input terminal of the amplifying stage 420_1, and the compensation unit 450_1 comprises a capacitor $C_{C1-1}$ coupled between the non-inverting input terminal of the amplifying stage 420_1 and the inverting output terminal of the amplifying stage 420_K, and a capacitor $C_{C1-1}$ coupled between the non-inverting input terminal of the amplifying stage 420_1 and the non-inverting output terminal of the amplifying stage 420_K. Specifically, for each of the amplifying stages 420_1-420_K, the corresponding compensation units are coupled between the input terminals thereof and the output terminals of the amplifying stage 420_K. In one embodiment, the corresponding compensation units can be replaced with a compensation capacitor $C_C$ for some of the amplifying stages 420_1-420_K.

Figure 7:
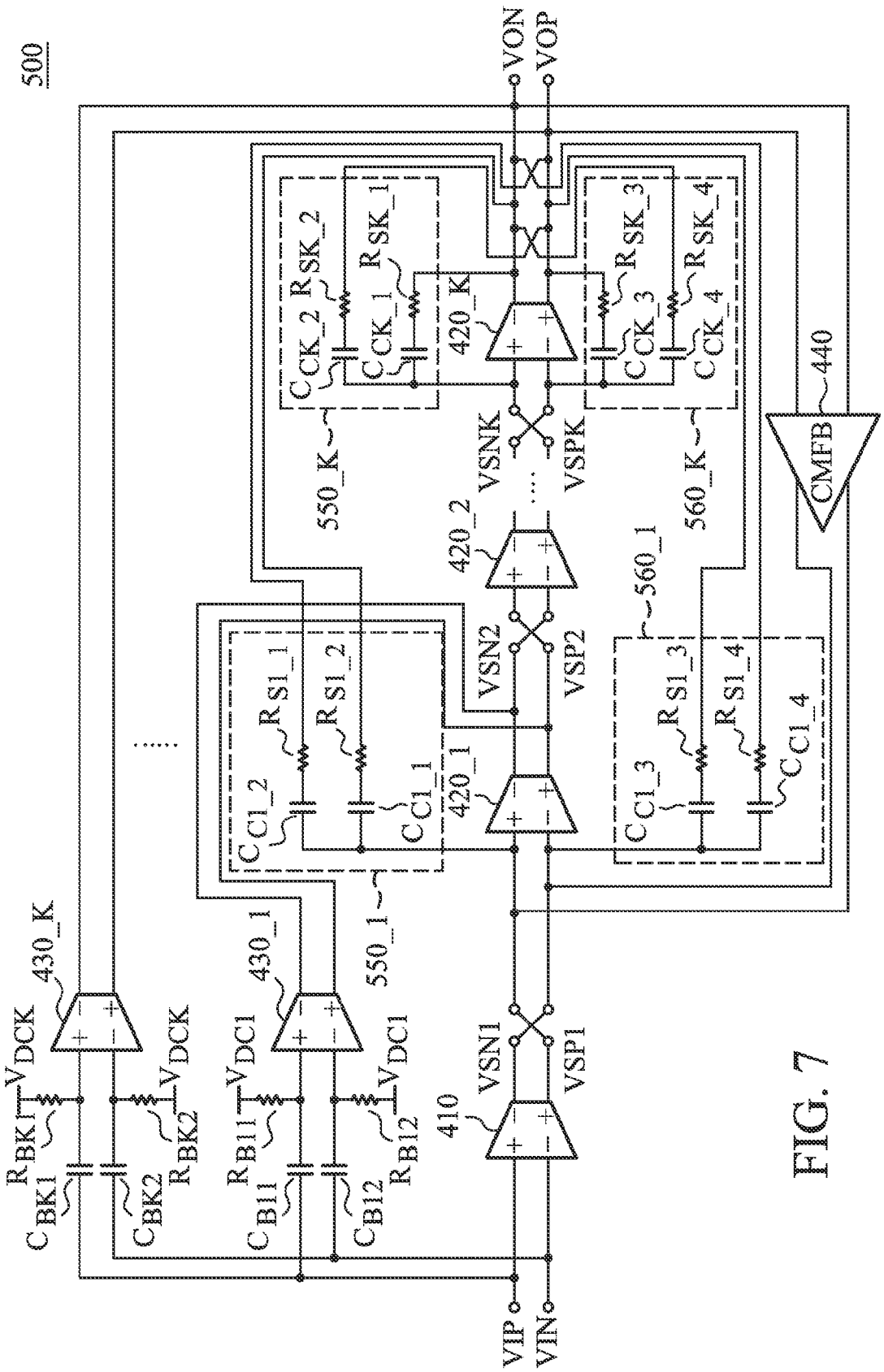
FIG. 7 shows an operational amplifier of a dynamic feed-forward OPAMP-based circuit according to another embodiment of the invention.

FIG. 7 shows an operational amplifier 500 of a dynamic feed-forward OPAMP-based circuit according to another embodiment of the invention. Compared with the operational amplifier 400 of FIG. 6, the corresponding compensation units further comprise the resistors respectively coupled to the capacitors thereof in series. For example, in a compensation unit 550_1, the resistors $R_{S1\_1}$ and $R_{S1\_2}$ are respectively coupled to the capacitors $C_{C1\_1}$ and $C_{C1\_2}$ in series. As described above, the series order of the resistors and capacitors can be swapped for the compensation units 550_1-550_K and 560_1-560_K.

Figure 8:
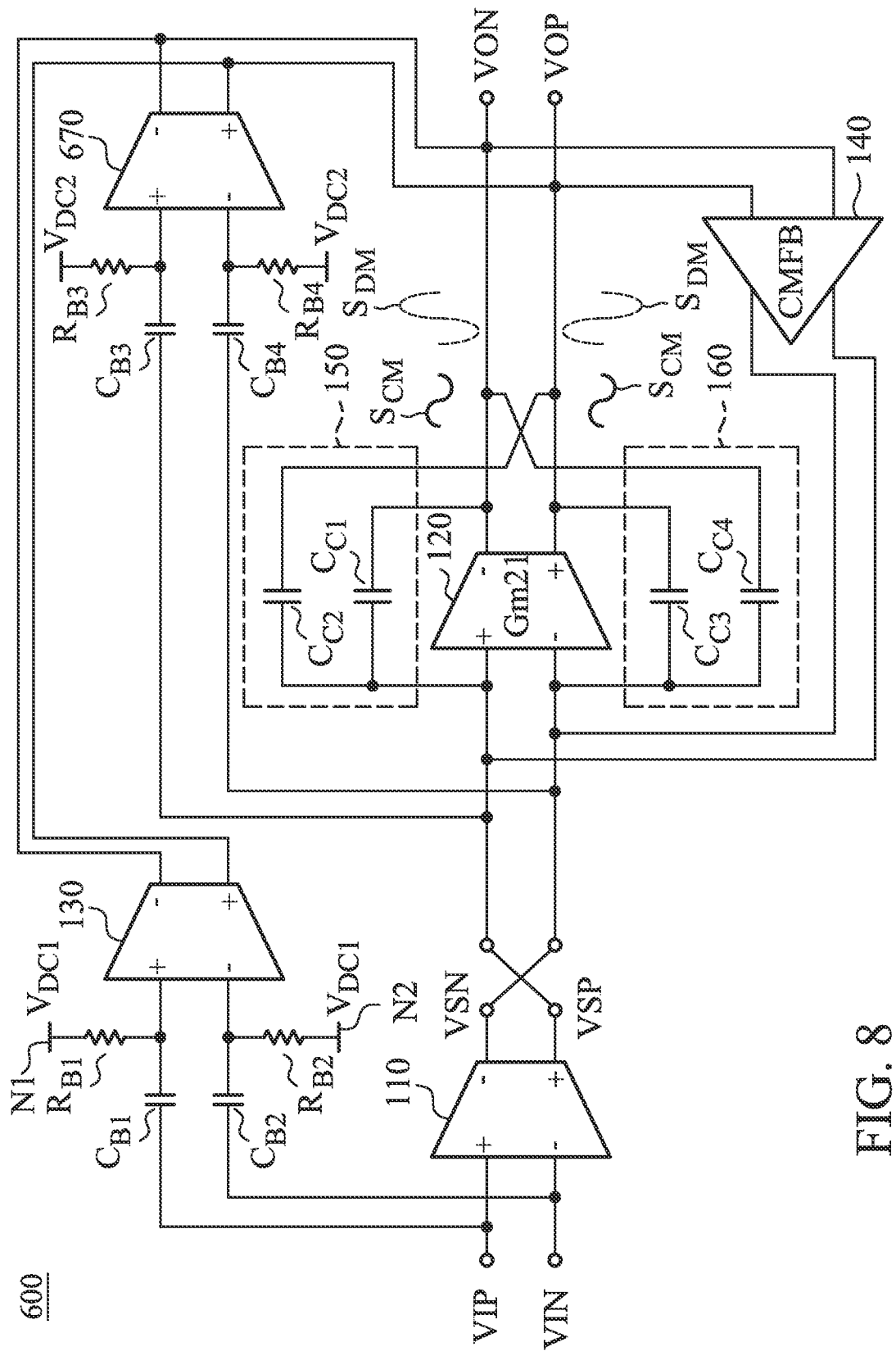
FIG. 8 shows an operational amplifier of a dynamic feed-forward OPAMP-based circuit according to another embodiment of the invention.

FIG. 8 shows an operational amplifier 600 of a dynamic feed-forward OPAMP-based circuit according to another embodiment of the invention. Compared with the operational amplifier 100 of FIG. 2, the operational amplifier 600 further comprises a feed-forward transconductance stage 670, two capacitors $C_{B3}$ and $C_{B3}$, and two resistors $R_{B3}$ and $R_{B4}$. The capacitor $C_{B3}$ is coupled between the non-inverting input terminal of the amplifying stage 120 and a non-inverting input terminal of the feed-forward transconductance stage 670, and the capacitor $C_{B4}$ is coupled between the inverting input terminal of the amplifying stage 120 and an inverting input terminal of the feed-forward transconductance stage 670. Furthermore, the non-inverting input terminal of the feed-forward transconductance stage 670 is pulled to a fixed reference voltage $V_{DC2}$ via the resistor $R_{B3}$, and the inverting input terminal of the feed-forward transconductance stage 670 is pulled to the fixed reference voltage $V_{DC2}$ via the resistor $R_{B4}$.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A dynamic feed-forward OPAMP-based circuit, comprising:
   an operational amplifier, comprising:
   a first amplifying stage, amplifying a pair of input differential signals to provide a pair of intermediate differential signals;
   a second amplifying stage, amplifying the pair of intermediate differential signals to provide a pair of output differential signals;
   a first capacitor coupled to a non-inverting input terminal of the first amplifying stage;
   a second capacitor coupled to an inverting input terminal of the first amplifying stage; and
   a feed-forward transconductance stage coupled between the first and second capacitors and the second amplifying stage,
   wherein the first and second capacitors and the feed-forward stage form a high-frequency path with a first gain curve for the pair of input differential signals, and the first amplifying stage and the second amplifying stage form a high-gain path with a second gain curve for the pair of input differential signals,
   wherein the operational amplifier provides an open-loop gain according to the first and second gain curves,
   wherein the operational amplifier provides the open-loop gain according to the second gain curve when a frequency of the pair of input differential signals is smaller than a specific frequency, and the operational amplifier provides the open-loop gain according to the first gain curve when the frequency of the pair of input differential signals is larger than the specific frequency, wherein the specific frequency is determined according to an inter-section of the first and second gain curves, and the second gain curve has two dominant poles smaller than the specific frequency.

2. The dynamic feed-forward OPAMP-based circuit as claimed in claim 1, further comprising:
   a first compensation unit, respectively providing a first capacitance and a second capacitance in a first negative feedback loop and a first positive feedback loop of the second amplifying stage; and
   a second compensation unit, respectively providing the first capacitance and the second capacitance in a second negative feedback loop and a second positive feedback loop of the second amplifying stage.

3. The dynamic feed-forward OPAMP-based circuit as claimed in claim 2, wherein the first compensation unit comprises:
   a third capacitor coupled between a non-inverting input terminal and an inverting output terminal of the second amplifying stage, having the first capacitance; and
   a fourth capacitor coupled between the non-inverting input terminal and a non-inverting output terminal of the second amplifying stage, having the second capacitance;
   wherein the second compensation unit comprises:
   a fifth capacitor coupled between an inverting input terminal and the non-inverting output terminal of the second amplifying stage, having the first capacitance; and
   a sixth capacitor coupled between the inverting input terminal and the inverting output terminal of the second amplifying stage, having the second capacitance.

4. The dynamic feed-forward OPAMP-based circuit as claimed in claim 3, further comprising:
   a third resistor connected with the third capacitor in series;
   a fourth resistor connected with the fourth capacitor in series;
   a fifth resistor connected with the fifth capacitor in series; and
   a sixth resistor connected with the sixth capacitor in series.

5. The dynamic feed-forward OPAMP-based circuit as claimed in claim 2, wherein each of the first and second compensation units provides an effective common-mode capacitance equal to the sum of the first and second capacitances, and each of the first and second compensation units provides an effective differential-mode capacitance equal to the difference between the first and second capacitances.

6. The dynamic feed-forward OPAMP-based circuit as claimed in claim 5, wherein the effective differential-mode capacitance is substantially equal to zero.

7. The dynamic feed-forward OPAMP-based circuit as claimed in claim 1, further comprising:
   a first resistor coupled between the first capacitor and a first reference node for receiving a fixed reference voltage; and
   a second resistor coupled between the second capacitor and a second reference node for receiving the fixed reference voltage.

8. The dynamic feed-forward OPAMP-based circuit as claimed in claim 7, further comprising:
   a third amplifying stage coupled to the second amplifying stage in parallel;
   a third resistor coupled between a non-inverting input terminal of the third amplifying stage and a third reference node for receiving the fixed reference voltage;
   a fourth resistor coupled between an inverting input terminal of the third amplifying stage and a fourth reference node for receiving the fixed reference voltage; a third capacitor coupled between the third resistor and a non-inverting input terminal of the second amplifying stage; and a fourth capacitor coupled between the fourth resistor and an inverting input terminal of the second amplifying stage.

9. The dynamic feed-forward OPAMP-based circuit as claimed in claim 1, further comprising:
a common-mode feedback stage coupled to the second amplifying stage in parallel.

10. The dynamic feed-forward OPAMP-based circuit as claimed in claim 1, wherein the operational amplifier is a class-AB amplifier.

11. The dynamic feed-forward OPAMP-based circuit as claimed in claim 1, wherein the dynamic feed-forward OPAMP-based circuit is applied in a transimpedance amplifier, a programmable-gain amplifier, a filter, an analog-to-digital converter buffer, or a delta-sigma analog-to-digital converter.

12. A dynamic feed-forward OPAMP-based circuit, comprising:
an operational amplifier, comprising:
a first amplifying stage, amplifying a pair of input differential signals to provide a pair of intermediate differential signals;
a second amplifying stage, amplifying the pair of intermediate differential signals to provide a pair of output differential signals;
a first capacitor coupled to a non-inverting input terminal of the first amplifying stage;
a second capacitor coupled to an inverting input terminal of the first amplifying stage;
a feed-forward transconductance stage coupled between the first and second capacitors and the second amplifying stage; and
a compensation unit coupled to the second amplifying stage, providing an effective common-mode capacitance and an effective differential-mode capacitance for the operational amplifier,
wherein the effective differential-mode capacitance is smaller than the effective common-mode capacitance,
wherein the compensation unit comprises:
a first unit, respectively providing a first capacitance and a second capacitance in a first negative feedback loop and a first positive feedback loop of the second amplifying stage; and
a second unit, respectively providing the first capacitance and the second capacitance in a second negative feedback loop and a second positive feedback loop of the second amplifying stage,
wherein the effective common-mode capacitance is equal to the sum of the first and second capacitances, and the effective differential-mode capacitance is equal to the difference between the first and second capacitances,
wherein the effective differential-mode capacitance is substantially equal to zero.

13. The dynamic feed-forward OPAMP-based circuit as claimed in claim 12, wherein the first unit comprises:

a third capacitor coupled between a non-inverting input terminal and an inverting output terminal of the second amplifying stage, having a first capacitance; and
a fourth capacitor coupled between the non-inverting input terminal and a non-inverting output terminal of the second amplifying stage, having a second capacitance;
wherein the second unit comprises:
a fifth capacitor coupled between an inverting input terminal and the non-inverting output terminal of the second amplifying stage, having the first capacitance; and
a sixth capacitor coupled between the inverting input terminal and the inverting output terminal of the second amplifying stage, having the second capacitance.

14. The dynamic feed-forward OPAMP-based circuit as claimed in claim 13, further comprising:
a third resistor connected with the third capacitor in series;
a fourth resistor connected with the fourth capacitor in series;
a fifth resistor connected with the fifth capacitor in series; and
a sixth resistor connected with the sixth capacitor in series.

15. The dynamic feed-forward OPAMP-based circuit as claimed in claim 12, further comprising:
a first resistor coupled between a first reference node for receiving a fixed reference voltage and the first capacitor;
a second resistor coupled between the second capacitor and a second reference node for receiving the fixed reference voltage; a third amplifying stage coupled to the second amplifying stage in parallel;
a third resistor coupled between a non-inverting input terminal of the third amplifying stage and a third reference node for receiving the fixed reference voltage;
a fourth resistor coupled between an inverting input terminal of the third amplifying stage and a fourth reference node for receiving the fixed reference voltage;
a third capacitor coupled between the third resistor and a non-inverting input terminal of the second amplifying stage; and
a fourth capacitor coupled between the fourth resistor and an inverting input terminal of the second amplifying stage.

16. The dynamic feed-forward OPAMP-based circuit as claimed in claim 12, further comprising:
a common-mode feedback stage coupled to the second amplifying stage in parallel.

17. The dynamic feed-forward OPAMP-based circuit as claimed in claim 12, wherein the operational amplifier is a class-AB amplifier.

18. The dynamic feed-forward OPAMP-based circuit as claimed in claim 12, wherein the dynamic feed-forward OPAMP-based circuit is applied in a transimpedance amplifier, a programmable-gain amplifier, a filter, an analog-to-digital converter buffer, or a delta-sigma analog-to-digital converter.

* * * * *